(12) United States Patent
Aliberti et al.

(10) Patent No.: US 8,788,142 B2
(45) Date of Patent: Jul. 22, 2014

(54) METHOD FOR THE CONTINUOUS MEASUREMENT OF THE EFFICIENCY OF A BATTERY, ESPECIALLY A BATTERY INSTALLED IN MOTOR VEHICLES, AND A DEVICE UTILIZING THIS METHOD

(75) Inventors: Roberto Aliberti, Montecchio Maggiore (IT); Silvia Cazzanti, Montecchio Maggiore (IT)

(73) Assignee: F.I.A.M.M. S.p.A., Montecchio Maggiore (IT)

( * ) Notice: Subject to any disclaimer, the term of this patent is extended or adjusted under 35 U.S.C. 154(b) by 33 days.

(21) Appl. No.: 13/504,396

(22) PCT Filed: Oct. 21, 2010

(86) PCT No.: PCT/EP2010/006436
§ 371 (c)(1),
(2), (4) Date: Jun. 22, 2012

(87) PCT Pub. No.: WO2011/050924
PCT Pub. Date: May 5, 2011

(65) Prior Publication Data
US 2012/0265397 A1    Oct. 18, 2012

(30) Foreign Application Priority Data

Oct. 27, 2009  (IT) .............................. MI2009A1868

(51) Int. Cl.
*G01R 31/36*    (2006.01)
(52) U.S. Cl.
USPC ......................................... 701/34.4; 702/63
(58) Field of Classification Search
USPC .......................................... 701/34.4; 702/63
See application file for complete search history.

(56) References Cited

U.S. PATENT DOCUMENTS 6,331,762 B1    12/2001  Bertness
6,369,578 B1     4/2002  Crouch, Jr. et al.
(Continued)

FOREIGN PATENT DOCUMENTS

DE          199 52 693    5/2001
DE     10 2008 008 238    8/2008
(Continued)

OTHER PUBLICATIONS

Sinclair et al., An Adaptive Battery Monitoring System for an Electric Vehicle, Jun. 1998, IEEE 0-7803-4879 pp. 786-791.*

(Continued)

*Primary Examiner* — Mary Cheung
*Assistant Examiner* — Michael Berns
(74) *Attorney, Agent, or Firm* — Oblon, Spivak, McClelland, Maier & Neustadt, L.L.P.

(57) ABSTRACT

A method for the continuous measurement of the efficiency of a battery, especially a battery installed in motor vehicles, comprising the following phases: —determination of the state of charge SOC % of the battery installed in the vehicle, both during key-off phase and key-on phase, without the direct measurement of current through progressive readings of battery voltage, both in the absence and in the presence of electrical load and considering the time elapsed since the beginning of each discharge phase; —determination of the state of health SOH of the same battery through the application of a controlled current load and the comparison of the resulting voltage drop compared to predetermined parameters; —determination of the state of function SOF of said battery through an estimation of its residual autonomy in function of the discharge rate or current rate and of the evolution of SOC %; —correlation and normalization of the above described parameters (SOC, SOH, and SOF) depending on the battery operating temperature;—memorization of at least the values of initial SOC % and SOH detected during the key—off phase.

10 Claims, 3 Drawing Sheets

(56) References Cited

U.S. PATENT DOCUMENTS

| | | | |
|---|---|---|---|
| 7,109,685 B2* | 9/2006 | Tate et al. | 320/132 |
| 7,593,823 B2* | 9/2009 | Iwane et al. | 702/63 |
| 7,612,532 B2* | 11/2009 | Verbrugge | 320/132 |
| 7,626,394 B2* | 12/2009 | Kimura et al. | 324/427 |
| 7,728,555 B2* | 6/2010 | Seo et al. | 320/132 |
| 7,759,901 B2* | 7/2010 | Hirsch et al. | 320/129 |
| 7,764,049 B2* | 7/2010 | Iwane et al. | 320/136 |
| 8,129,996 B2* | 3/2012 | Iwane et al. | 324/427 |
| 2004/0024546 A1 | 2/2004 | Richter | |
| 2005/0057255 A1 | 3/2005 | Tate et al. | |
| 2006/0284600 A1 | 12/2006 | Verbrugge | |
| 2007/0139015 A1* | 6/2007 | Seo et al. | 320/132 |
| 2008/0036421 A1* | 2/2008 | Seo et al. | 320/132 |
| 2008/0048662 A1 | 2/2008 | Hirsch et al. | |
| 2008/0120050 A1 | 5/2008 | Iwane et al. | |
| 2008/0204031 A1 | 8/2008 | Iwane et al. | |
| 2008/0231284 A1 | 9/2008 | Birke et al. | |
| 2009/0027007 A1 | 1/2009 | Iwane et al. | |
| 2010/0045298 A1 | 2/2010 | Iwane et al. | |

FOREIGN PATENT DOCUMENTS

| | | |
|---|---|---|
| EP | 1 343 017 | 9/2003 |
| EP | 1 892 536 | 2/2008 |
| EP | 1 933 158 | 6/2008 |
| EP | 1 933 159 | 6/2008 |
| EP | 1 972 956 | 9/2008 |
| JP | 2008 128802 | 6/2008 |
| WO | 2007 048367 | 5/2007 |

OTHER PUBLICATIONS

International Search Report Issued Apr. 7, 2011 in PCT/EP10/06436 Filed Oct. 21, 2010.

* cited by examiner

Subdivision of of the ΔV = f(SOC%) plane

Trend of m in function of the discharge rate, i(A)

Variation of SOC% over time during discharge of 100 Ah batteries at different current rates Initially, the batteries have a 90% state of charge.

METHOD FOR THE CONTINUOUS MEASUREMENT OF THE EFFICIENCY OF A BATTERY, ESPECIALLY A BATTERY INSTALLED IN MOTOR VEHICLES, AND A DEVICE UTILIZING THIS METHOD

FIELD

The present invention relates to a method for the continuous measurement of the efficiency of a battery, especially a battery installed in motor vehicles, in addition to the respective device based on the use of this method.

More specifically, the present invention relates to a method which provides information concerning the state of charge (SOC), state of health (SOH) and state of function (SOF) of batteries during use in a motor vehicle; the invention, according to this method, also concerns a device connected directly to the battery installed in the motor vehicle, capable of continuously monitoring the above-mentioned battery states and of detecting the approach of critical conditions which do not allow engine restart.

BACKGROUND

As is known, the starter batteries used in motor vehicles for engine start-up and for powering electrical equipment are prone to gradual discharge and, with the engine running, the alternator compensates for their loss of energy. However, over time, battery efficiency is reduced, even in the presence of constant recharging from the alternator. This drop in efficiency is not usually detected, nor signalled to the user, and usually results in said users needing to address the problem when it is too late, i.e. when the battery has insufficient charge and/or functionality to start the engine. This situation causes great inconvenience, and is often made worse by the fact that users find themselves in places lacking a readily available battery replacement service.

It should also be considered that increasing numbers of vehicles are equipped with 'Stop and Start' technology. This includes devices which automatically switch off the engine during stops—in order to reduce atmospheric emissions of harmful gases, as well as to reduce fuel consumption. In these conditions a battery, in poor condition, may have difficulty in withstanding continuous engine restarts and the danger of a sudden enforced stop is therefore real. In an attempt to solve this problem a method and a device have been designed, by the same applicant, which enables the detection of battery efficiency, as described in Italian patent No. 1.357.179/2003. Such patent right, however, refers to the determination of the state of charge of batteries in open circuit conditions. The state of health of the battery, indicated by SOH (State of Health), is taken as an identification parameter of the battery condition and its value determines whether said battery is charged, uncharged or to be replaced. The SOH is a function of the state of charge SOC of the battery, directly determinable from the open circuit voltage of the battery itself and its degree of ageing, which results in quantitative terms, in an increase in the battery's internal resistance, which the method described in the above named patent measures through the application of a controlled current load under predefined conditions. This method, although valid, is more suitable for the realization of a bench device, given that it identifies the state of charge in open-circuit or key-off conditions.

Other methods and devices are also known for detecting the state of charge of batteries in key-on conditions, but these solutions are based on the measurement of currents, and hence result in complex and expensive equipment. Solutions of this type are known, for example, from U.S. Pats. No. 6,453,129 and 6,369,578 in addition to DE 19952693 and EP 0908737.

SUMMARY

The object of the present invention is to overcome the above mentioned drawbacks.

More specifically, the object of the present invention is to provide a method and a device which enables the continuous monitoring of the SOC, SOF and SOH states of a battery and the respective variations, both in conditions of open circuit or key-off, as well as closed circuit or key-on conditions.

A further object of the invention is to provide a method and a device for determining the residual autonomy of the battery.

A further object of the invention is to provide a method and a device capable of detecting the current rate at which the battery is discharging.

These and other objects are still achieved by the method for the continuous measurement of the efficiency of a battery and by the device utilizing such method according to the invention in accordance with the enclosed claims.

BRIEF DESCRIPTION OF DRAWINGS

The characteristics of the method for the continuous measurement of the efficiency of a battery of the present invention can be better understood from the detailed description that follows, which refers to the enclosed figures which should be considered as having an illustrative and non-limiting aim, respectively.

DETAILED DESCRIPTION

With reference to the enclosed figures, the method for the continuous measurement of the efficiency of a battery, according to the present invention, includes at least one first phase which determines its State of Charge (SOC) and State of Health (SOH) levels, with the vehicle engine switched off, i.e. in key-off condition. The SOC % is determined by the open circuit voltage (OCV) of the battery, which is reached only after a period in which the vehicle has been left with its engine switched off. This OCV value is obtained from the relation $V_{ocv}=f(t)$, which extrapolates the value of stabilized OCV in function of the key-off time.

The open circuit voltage OCV enables the calculation of the initial SOC % which, when quantified, permits the determination of SOH; this is achieved by applying a controlled current load (e.g. between 15 and 50A) and recording, at the same time, the voltage drop $\Delta V$ (i.e. the difference between the two voltage values measured) which occurs in a given time period. The latter is preferably between 0.1 and 30 seconds.

The SOH value obtained in this manner is a function of SOC % and $\Delta V$, i.e. SOH=f (SOC %, $\Delta V$). The result indicates the state of health of the battery, allowing the determination of whether it is in a condition to start the engine with particular, but not exclusive, reference to the presence of a Stop and Start device in the vehicle.

The two parameters SOC % and $\Delta V$, also consequently like the parameter SOH, are a function of the temperature. The values which are determined through such measurements must therefore be fixed in relation to the temperature noted at the time of the measurements.

Figure 2:
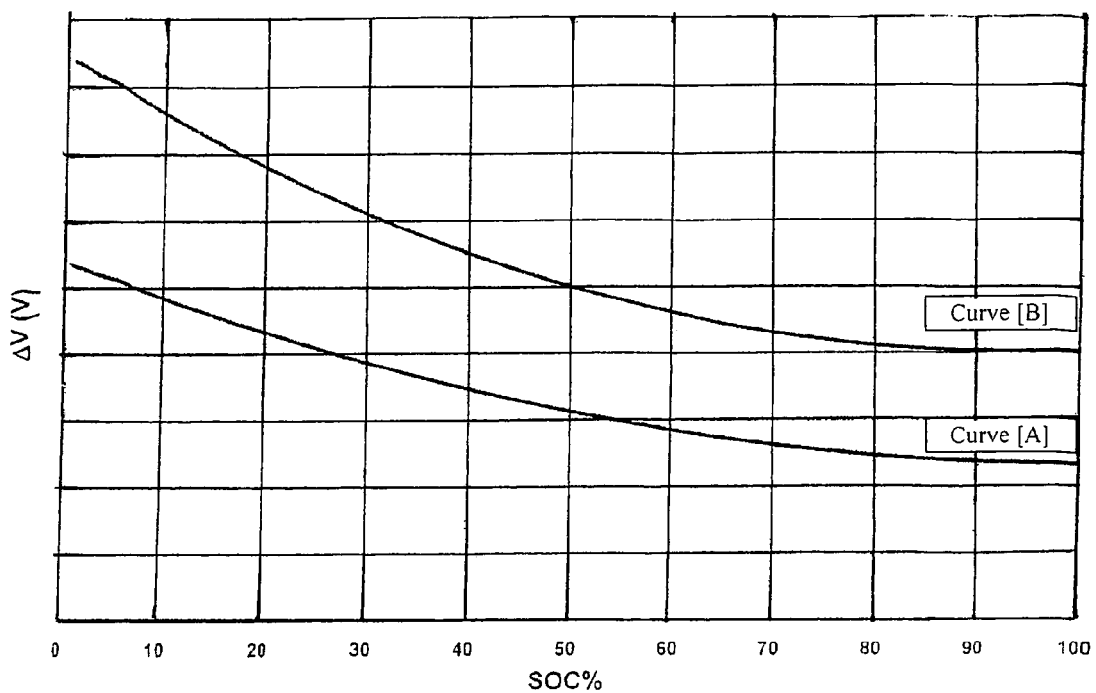
FIGS. 2, 3 and 4 serve as reference diagrams of the method according to the invention.

Using the SOC % and ΔV data, the initial value of SOH is defined through the cartesian plane of FIG. 2 which illustrates the subdivision of the areas that differentiate the conditions of a battery in a dynamic situation. First of all, two quantities are fixed that define the limits within which engine start-up is guaranteed; in particular, a SOC $\%_{min}$ is established, below which engine start-up is not guaranteed and a $\Delta V_{max}$ above which engine start-up is not guaranteed. At this point, the value of ΔV that is recorded following the application of the load, is normalized within the area delimited by the curves [A] and [B] as shown in FIG. 2, so that the parameter SOH is converted into a numerical value between 0 (curve [B]) and 1 (curve [A]), through the relation:

$$(b-\Delta V)/(b-a),$$

where "b" denotes the voltage drop that occurs, by application of the controlled current load, at a certain SOC % value, corresponding to the points lying on curve [B] in FIG. 2 and above which the resulting SOH indicates that the battery is not in good condition. Instead "a" indicates the minimum voltage drop that occurs at a certain SOC % value by application of the controlled current load and corresponding to the points lying on curve [A]. In order to correlate the value of said relation:

$$SOH_{25°\,C\,(where\,25°\,indicates\,the\,reference\,temperature\,of\,the\,battery)} = (b-\Delta V)/(b-a)$$

at the state of charge of the battery and thus evaluate the degree of ageing in relation to that specific state of charge, it is sufficient to check to what extent this point deviates from the corresponding value on curve [A] through the additional relation: $1-[(b-\Delta V)/(b-a)]$, which gives the value E3 corresponding to a number between zero and 1, indicative of the degree of ageing of the battery in relation to a given SOC % value. The E3 values approaching zero refer to new batteries with a certain state of charge, whereas values close to 1 concern batteries with a certain degree of ageing, to which greater attention should be paid, which is expressed, according to the method of the present invention, in a more frequent monitoring of the states: SOC %, SOF and SOH.

After all, in fact, if $E3 \leq 1-[(b-\Delta V)/(b-a)]$, the battery can be considered efficient, otherwise an alarm (in sound and/or visual form) is activated on a particular device connected to the battery, or alternatively the functions connected with this parameter will be inhibited or the calculations to determine the states SOC %, SOH and SOF and their possible variations will be repeated with greater frequency.

The above described key-off phase involves the measurement, calculation and storage of the initial SOC % and SOH values.

The voltage at the battery terminals is monitored during the key-on phase, so as to distinguish when the battery is being charged by the alternator, or when a discharge phase starts.

The voltage is monitored according to the following model:
ti=0 and Vi=Vo, where Vi is the battery voltage measured at time ti=0 in which the device starts the voltage measurement, tn=ti+Δt, where Δt is the time interval when the battery voltage is detected, and $V_n = V_{tn}$.

When the following situations are encountered:

$$V_{tn} - V_{(tn-\Delta t)} > -(0.05-0.5)V;$$

$$V_{tn} - V_{(tn-2\Delta t)} > -(0.05-0.5)V;$$

$$V_{tn} - V_{(tn-3\Delta t)} > -(0.05-0.5)V;$$

the battery begins to discharge, therefore it is necessary to set the function to determine the discharge rate.

If the battery has been diagnosed in discharge condition, then the discharge rate or the current rate is determined (described in detail below) by means of the three parameters: initial SOC %, $V_n$ and $t_n$ which represent respectively: SOC %=state of charge, $V_n$=battery voltage at the time $t_n$ and $t_n$=time in seconds counted from the beginning of a discharge phase.

Furthermore, based on the discharge rate or the calculated current rate and the initial SOC % value of the battery, it is possible to determine the residual autonomy of the same battery according to that current rate and according to the evolution of SOC % during the discharge.

Considering the fact that, in normal conditions of use, the current varies continuously, this phase of the procedure is repeated in order to continuously update the battery's actual SOC % value, using the method of the present invention. In particular, it is possible to detect the change in discharge rate of the battery by observing the voltage and then continuously updating the calculation of the discharge rate and, hence, the SOC % and of the remaining battery power to the n-th time in which the calculation is started. To determine the discharge rate or the current rate, in the event in which the battery has been diagnosed in a discharge condition (and not being charged by the alternator) the following quantities are established:

$$V_n, t_n, t_n-3\Delta t=0, SOC\%_{init}=SOC\%_{tn-3\Delta t}$$

Thus a "$y_o$" parameter and an additional A1 parameter are identified, both being functions of the battery voltage, $V_n$, as well as the initial state of charge of the battery.

The parameter $y_o$ is a numerical coefficient, like that of A1, whose numerical values can be determined from the initial SOC % and the voltage $V_n$ detected by the device at time $t_n$ In particular, $y_o$ is a function of the voltage $V_n$ through the relation:

$$y_o = B1*(-V_n) + B2*(-V_o)^2 + B3$$

The dependence of $y_o$ on the initial SOC % is derived from the parameters B1, B2 and B3 which vary linearly in function of the initial SOC % of the battery.

In the event of A1, the dependence on the voltage Vn is expressed by the following relation:

$$A1 = C*\exp(-\exp(-k1*((-V_n)-k2)))$$

In which k2 and k3 are constants, while through parameter C the value of A1 is corrected in function of the initial SOC %. In fact, C is a function of the initial SOC %.

Through the two parameters A1 and y0 described above, one can determine the current rate i(A) at which the battery is discharging through the following relation:

$$i(A) = -k_3 \cdot \ln[(t_n - y_o)/A1],$$

where k3 is a constant and i(A) corresponds to the current in amperes.

At this point, given the value i(A) that indicates at which current rate the battery is discharging, it is possible to calculate the SOC % value of the battery at the time $t_n$. The value of i(A) is used to determine the parameter m, which indicates the gradient, or angular coefficient, of the linear correlation between the SOC %, which evolves during the discharge, and the time $t_n$, (described later) through the relation:

$$m = k_4 \cdot [i(A)^2] + k_5 \cdot [i(A)] + k_6$$

in which $k_4$, $k_5$ and $k_6$ are numerical coefficients that allow the mathematical correlation between the current i(A) and the angular coefficient m, subsequently used to determine the variation of the SOC %. These numerical coefficients, $k_4$, $k_5$ and $k_6$ vary depending on the capacity of the battery on which the device is installed.

Figure 3:
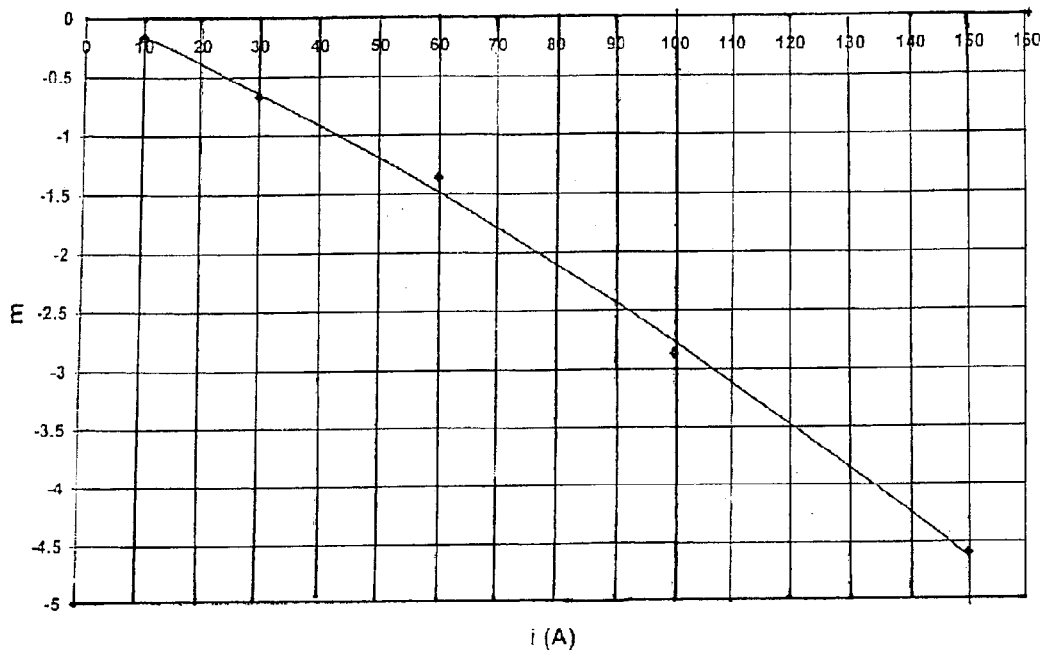

The trend that indicates the variation of the angular coefficient "m" in function of the calculated current discharge rate is shown in FIG. 3.

Through the value "m" it is therefore possible to calculate the SOC % at time $t_n$ with the following relation:

$$SOC\ \% = m \cdot (t_n) + SOC\ \%_{init}$$

Figure 4:
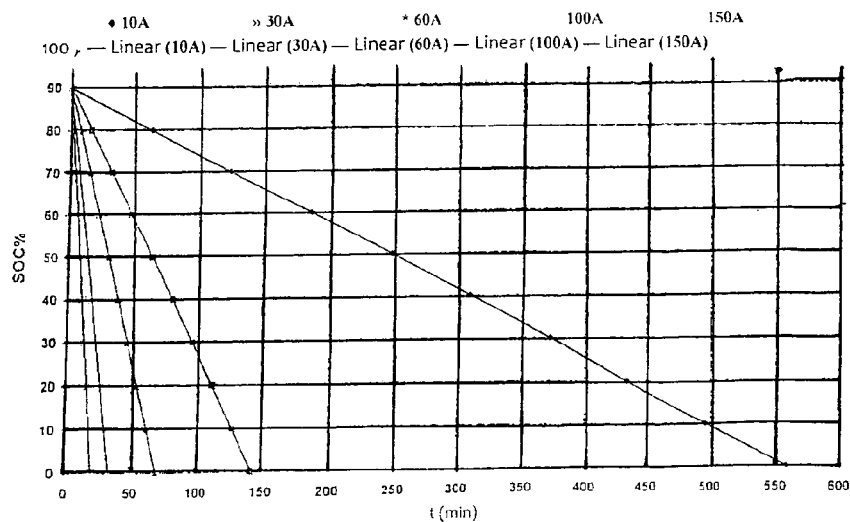

The relative trend is illustrated in FIG. 4 specifically, and by way of example, for 100 Ah batteries with an initial SOC % of 90%. This trend was also verified in the other charge states and in lower capacity batteries.

Figure 1:
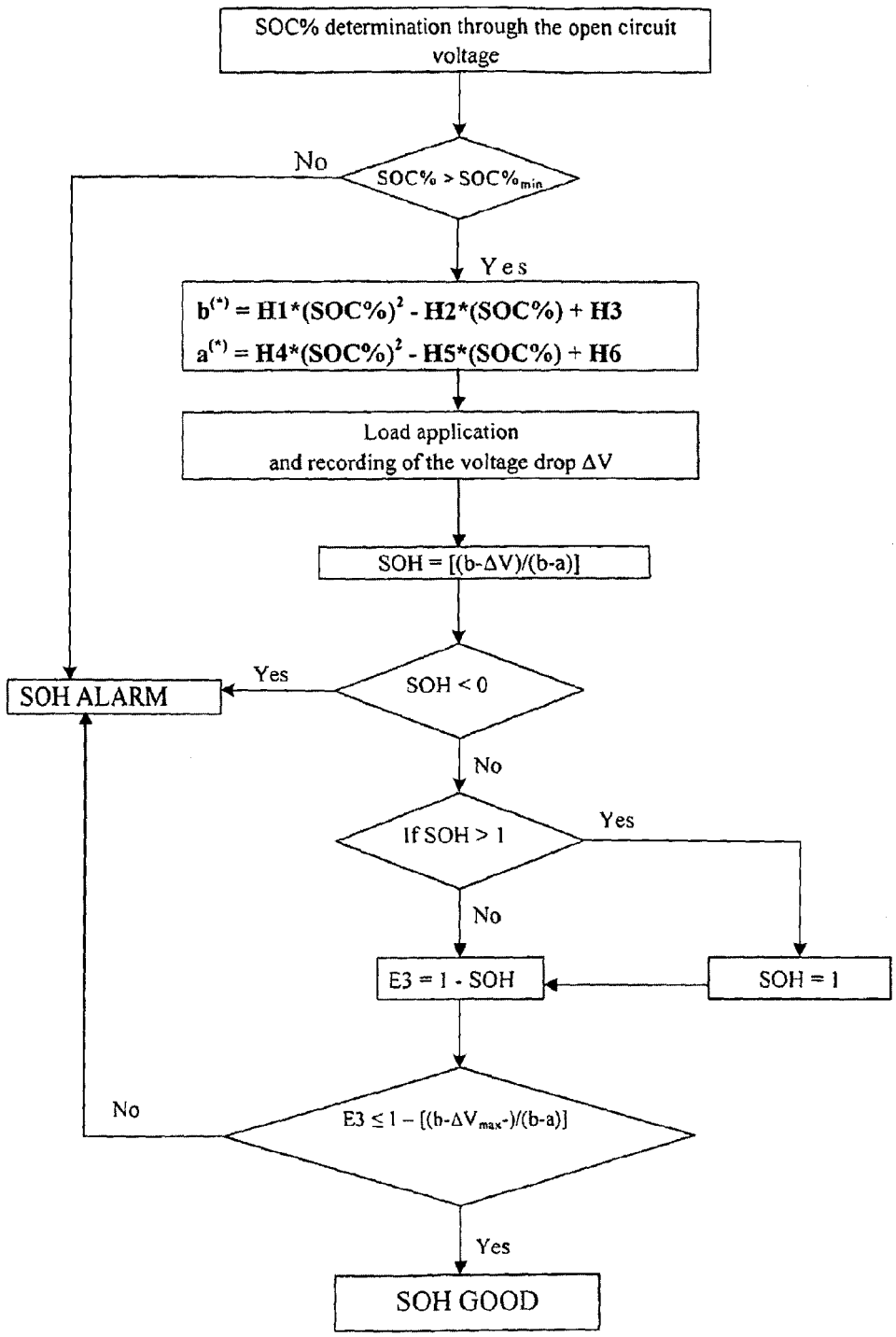
FIG. 1 is a block diagram relating to the calculation of the state of health SOH of the battery, according to the method of the present invention.

The voltage is systematically monitored and when it detects a variation that indicates a drop, for example, of between 3% and 7% from the initial SOC % value, the SOH value of the battery is calculated at time $t_n$, by the application of a controlled current load according to the previously described methods and is verified according to the block diagram of FIG. 1. In relation to this diagram, it is established whether the new SOH value calculated at time $t_n$ is indicative of a battery which is still capable of withstanding a discharge rate or not, and the respective values are transmitted in output.

The above calculation, which allows the estimation of the current rate under which the battery is discharging and the gradual evolution of SOC %, allows the determination of residual battery autonomy, which is defined by the SOF. In fact, during a discharge phase, the continuous variation of the current load that draws on the battery involves a continuous change in the rate of evolution of SOC %. Thus, having set a SOC $\%_{min}$, the SOF will be a parameter, a function of i(A) (current rate at which the battery is discharging), of the SOC % value fixed as SOC $\%_{min}$, of SOC % calculated at the time $t_n$ and, hence, also of the temperature.

$$SOF = f(i(A), SOC\ \%_{min}, SOC\ \%, T^\circ\ C.).$$

The continuous variation of i(A) and consequently of SOC % will therefore result in a continuous variation of the residual battery autonomy, which will be expressed by the parameter SOF.

Said device, installed in the vehicle and in electrical contact with the battery, by which it is powered, includes at least one temperature sensor and one voltage sensor, with connecting wires to the battery terminals, a predetermined and controlled resistive load, an electronic monitoring, recording, processing and data storage card, must be able to transmit in output the processed information (encoded or not), with the possible transmission of an audible and/or visible signal to the driver of the vehicle.

Although the invention has been described above with particular reference to one embodiment, which should be considered as having an illustrative and non-limiting aim, numerous modifications and variations will appear obvious to a person skilled in the art, in light of the above description. Therefore the present invention intends to cover all modifications and variations that fall within the spirit and scope of protection of the following claims.

The invention claimed is:

1. A method, for a device including processing circuitry, for continuous measurement of efficiency of a battery, installed in a vehicle, the method comprising:
   computing by the processing circuitry, a state of charge SOC of the battery installed in the vehicle throughout both a key-off phase and a key-on phase, without a direct measurement of current, the computing being performed by progressively reading a battery voltage, both in absence and in presence of an electrical load and considering a time elapsed since a beginning of each discharge phase;
   determining a state of health SOH, of the battery by applying a controlled current load and comparing a resulting voltage drop to predetermined parameters;
   determining a state of function SOF, of the battery by estimating a residual autonomy that is a function of a discharge rate or current rate, and of an evolution of the SOC;
   correlating and normalizing the SOC, SOH, and SOF based on an operating temperature of the battery; and
   storing at least an initial SOC and SOH that are determined during the key-off phase.

2. The method for continuous measurement of efficiency of a battery as in claim 1, further comprising:
   repeating, a periodic determination of the SOC, SOH and SOF; and
   storing the periodically determined SOC, SOH and SOF.

3. The method for continuous measurement of efficiency of a battery as in claim 1, wherein the progressively read battery voltage is used to determine when the battery is in a state of discharge.

4. The method for continuous measurement of efficiency of a battery as in claim 1, wherein the current rate or current discharge rate is determined based on the initial SOC, time in seconds counted from the beginning of the discharge phase (tn), and the battery voltage (Vn), determined at time tn.

5. The method for continuous measurement of efficiency of a battery as in claim 1, wherein a variation of the SOC is evaluated by determining the discharge rate.

6. The method for continuous measurement of efficiency of a battery as in claim 1, wherein the determination of SOH at an n-th time is correlated to the SOC at the n-th time by evaluating a voltage drop $\Delta V$ that is determined by applying a controlled and constant current load of 15-50 A for a predetermined period of time of 0.1-30 seconds.

7. The method for continuous measurement of efficiency of a battery as in claim 1, wherein an initial SOH value is converted into a numerical value between 0 and 1 through the relation: $(b-\Delta V)/(b-a)$, wherein "b" is a voltage drop that occurs at a first predetermined value of the SOC by application of the controlled current load, and "a" is a minimum voltage drop that occurs by application of the controlled current load at a second predetermined value of the SOC.

8. The method for continuous measurement of efficiency of a battery as in claim 1, wherein the SOF is related to the residual autonomy of the battery at all times, the SOC and a SOC limit, the residual autonomy being determined by evaluation of the discharge rate and the SOC limit defining a guarantee of engine restart.

9. A device for continuous measurement of efficiency of a battery, the device being installed in a vehicle and being in electrical contact with the battery, by which it is powered, the device comprising:
   at least one temperature sensor and one voltage sensor;
   a predetermined and controlled resistive load; and
   processing circuitry configured to
      compute a state of charge SOC of the battery installed in the vehicle throughout both a key-off phase and a key-on phase, without a direct measurement of current, the computing being performed by progressively reading a battery voltage, both in absence and in presence of an electrical load and considering a time elapsed since a beginning of each discharge phase, determine a state of health SOH of the battery by applying a controlled current load and comparing a resulting voltage drop to predetermined parameters;

determine a state of function SOF of the battery by estimating a residual autonomy that is a function of a discharge rate or current rate, and of an evolution of the SOC, correlate and normalize the SOC, SOH, and SOF based on an operating temperature of the battery, and store at least an initial SOC and SOH that are determined during the key-off phase.

10. The device of claim 9, wherein the processing circuitry is further configured to transmit an audible or visual signal to a driver of the vehicle, when the computed SOC is less than a predetermined minimum SOC value.

* * * * *